(12) United States Patent
Bambridge

(10) Patent No.: US 7,221,042 B2
(45) Date of Patent: May 22, 2007

(54) LEADFRAME DESIGNS FOR INTEGRATED CIRCUIT PLASTIC PACKAGES

(75) Inventor: Timothy B. Bambridge, Pittstown, NJ (US)

(73) Assignee: Agere Systems Inc, Allentown, PA (US)

( * ) Notice: Subject to any disclaimer, the term of this patent is extended or adjusted under 35 U.S.C. 154(b) by 210 days.

(21) Appl. No.: 10/997,630

(22) Filed: Nov. 24, 2004

(65) Prior Publication Data

US 2006/0108670 A1    May 25, 2006

(51) Int. Cl.
*H01L 23/495* (2006.01)
*H01L 23/10* (2006.01)

(52) U.S. Cl. .................. 257/666; 257/706; 257/675; 438/122; 438/123; 438/125

(58) Field of Classification Search ............... 257/666, 257/675
See application file for complete search history.

(56) References Cited

U.S. PATENT DOCUMENTS 3,839,660 A * 10/1974 Stryker .................. 257/700

5,345,106 A * 9/1994 Doering et al. ............. 257/675

FOREIGN PATENT DOCUMENTS

JP        06-268134      * 9/1994

* cited by examiner

*Primary Examiner*—Long K. Tran

(57) ABSTRACT

The specification describes a plastic cavity package design for high power transistor packages in which the leadframe is formed of a composite of materials. This allows the portions of the leadframe that require strength to be formed of a high strength material, e.g. steel, while the paddle portion of the leadframe is formed of a high thermal conductivity material, e.g. copper. This composite leadframe optimizes thermal and mechanical performance at low cost. In the preferred embodiment the leadframe is provided with a center cutout, where the die is attached. A copper insert is assembled in the cutout. The copper insert provides an effective heat sink, while the remainder of the leadframe provides the desired mechanical strength.

11 Claims, 3 Drawing Sheets

LEADFRAME DESIGNS FOR INTEGRATED CIRCUIT PLASTIC PACKAGES

FIELD OF THE INVENTION

This invention relates to leadframe designs used in plastic overmolded packages for integrated circuit (IC) and related devices.

BACKGROUND OF THE INVENTION (Portions of the technical material contained in this section may not be prior art.)

A common element in packaging electronic IC devices is a plastic housing. In the most typical IC plastic package, electronic components are assembled on a metal leadframe and a polymer is molded over the assembly to encapsulate the device and portions of the leadframe. The leadframe serves not only to support the electronic components, but has metal tabs that extend from the overmolded plastic and provide a means to electrically connect to the encapsulated electronic components.

Recent modifications of the molded plastic IC package include an air cavity design wherein the housing for the package is plastic, but is pre-molded over a lead frame before the IC device is assembled into the package. This design offers the advantage that the IC chip is not exposed to the rigors and heat of the overmolding step used to produce the plastic encapsulated (overmolded) package. In this design the IC device environment may be an air cavity, or the cavity may be filled after the IC chip is die and wire bonded. The cavity filling may be any polymer, including polymers that cure at low temperatures. The choice of filling material is wider than the choices available in the case of overmolded plastic packages, since the choice is independent of the material used for the pre-molded plastic housing. For example, the material is often chosen for low loss at RF frequencies so that less power is dissipated in the packaging material. Thus in a pre-molded plastic cavity package, the IC chip may still be polymer encapsulated, but the heat required for a typical overmolding step may be avoided.

Leadframes of the prior art typically are square or rectangular and have a center paddle to which the semiconductor chip is die bonded. Leadframes are typically stamped from copper or copper alloy sheets. (In the following discussion, use of the term copper is intended by inference to include copper alloys). The leads that provide electrical interconnection extend from the sides of the paddle, often along two opposing edges of the leadframe. The number of leads may vary widely. Common RF power devices, for example, RFLDMOS devices, may have only a few leads, one per side for each transistor. Traditionally the power RF transistor packages have been fabricated from ceramic and powder metal composites that provide the strength needed for the bolt down flange. These packages are expensive.

Whereas the use of copper as the leadframe material offers the advantage of high electrical and thermal conductivity, there are device applications where a copper leadframe is not suitable. For example, in some IC device package designs, the leadframe has a large paddle, to which the IC die is attached, and further comprises tabs extending from the sides of the paddle. The tabs on two opposing sides serve as electrical connectors. The tabs on the other two opposing sides serve as hold-down members that allow the IC package to be attached to a support structure. This type of package is commonly used for RF power devices, such as LDMOS transistors, that have only one, or a few, leads per side. If copper is used as the leadframe material for this type of package, the copper has to be made much thicker in order to match the strength of the leadframe in the ceramic/metal package that the plastic package replaces.

Thus both the tab leads and the hold-down members may require a material with more strength than standard copper leadframes provide. Accordingly, the leadframe material in these devices should be a stronger metal. Steel is favored from a cost standpoint. It is recognized that the comparatively low electrical conductivity of steel is of limited consequence in a leadframe where the paddle is not a conductor member. However, the lower thermal conductivity of steel compared with copper is significant in a power transistor device. A major issue in the design and performance of power transistors is heat dissipation. The steel paddle may not afford an effective heat sink for some power transistors.

BRIEF STATEMENT OF THE INVENTION

A new leadframe design for high power transistor packages has been developed in which the leadframe body is formed of a composite of materials. This allows the portions of the leadframe that require strength to be formed of a high strength material, e.g. steel, while the paddle portion of the leadframe is formed of a high thermal conductivity material, e.g. copper. The copper paddle portion serves as an effective heat sink for the power transistor. This composite leadframe optimizes thermal and mechanical performance at low cost. In the preferred embodiment the leadframe is steel and is provided with a center cutout, where the die is attached. A copper insert is assembled in the cutout. The copper insert provides an effective heat sink, while the remainder of the leadframe provides the desired mechanical strength. The invention is aimed at plastic cavity packages but may be used in conventional overmolded plastic packages.

BRIEF DESCRIPTION OF THE DRAWING

The invention may be better understood when considered in conjunction with the drawing in which.

DETAILED DESCRIPTION OF THE INVENTION

The invention will be described in more detail using, as a prototypical package, a plastic cavity RFLDMOS power transistor package. The invention was developed around this type of package and it represents a preferred embodiment. However, it should be understood that other kinds of IC devices may be packaged using the approach described. Also other types of IC packages may favorably utilize the essential features of the invention. The plastic cavity packaging format is represented here by way of example only. A wide variety of plastic package designs are available in the packaging industry, including plastic overmolded packages. Many will share the properties described below. All plastic package products that have the features to be described are intended to be included in the scope of the invention.

Figure 1:
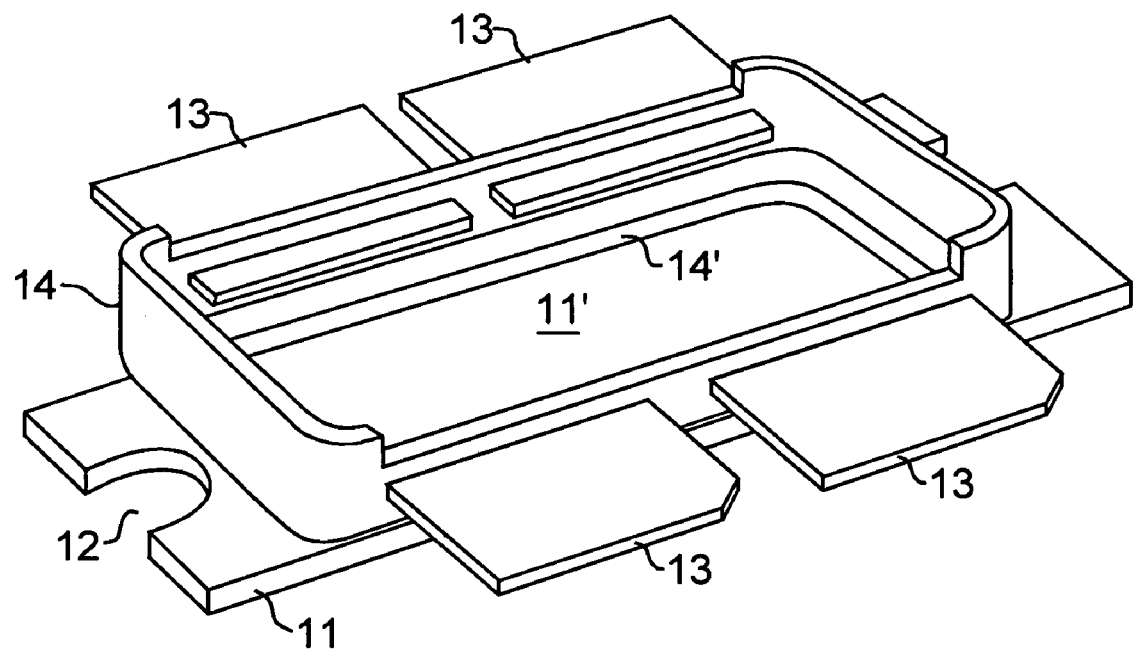
FIG. 1 is a perspective view of a conventional air cavity plastic package prior to die attachment.

Referring to FIG. 1, a perspective view of a plastic cavity package is shown with a metal chip support member 11 comprising at least a portion of what is conventionally considered the leadframe. The leadframe 11 is notched at 12 for insertion of a screw, or other suitable attachment means, to attach the finished IC device to a circuit board or other carrier. This allows the leadframe for the power device to be firmly mounted on the circuit board or on a heat sink, and suitable connectors (not shown) can be attached easily to tab leads 13 on the power device. Although a single power diode, like that described here, may require only one lead 13 per side, it is not unusual for an electrical lead 13 to be split. Accordingly, the single lead per side (or each of multiple leads per side) may be split into two or more sections. Typical power transistor RFLDMOS packages that have the JEDEC standard MO-166 form factor have 1-4 leads per side, and 2-8 leads overall.

Molded to the leadframe 11 is a plastic housing 14. The housing comprises four walls and a bottom, preferably all comprising an integral body that encloses a cavity. The center region of the bottom of the plastic housing is open, exposing the portion 11' of the leadframe inside the cavity. The edge of the opening is seen in FIG. 1 at 14'.

The plastic housing is typically molded to the leadframe by a conventional molding/extrusion process. Anchoring methods may be used to increase the integrity of the attachment. For example, tabs or holes may be formed in the leadframe 11 through which the molded plastic penetrates during molding. These act as anchors after the mold compound cures.

The plastic used for the cavity housing may be selected from a wide variety of polymers. It is particularly desirable to choose a material that will result in a plastic body capable of withstanding a relatively high temperature, so as to facilitate the die attach process.

A main feature of the plastic cavity approach to IC device packaging is that the plastic housing for the package is formed prior to assembling the IC component on the metal support. In the most typical prior art plastic package, the plastic overmolded package, the IC die are attached to a metal leadframe prior to molding the plastic encapsulant around the die and leadframe. This versatile approach has been used to manufacture the vast majority of IC device packages. However, recent trends in IC packaging are toward pre-molded plastic housings, where the plastic housing can be shaped with precision, choice of the material of the plastic housing can be made from a wider selection, the plastic for the housing may be different from the polymer used to encapsulate the IC device, and the IC device is not exposed to the temperatures required for the overmolding process.

The embodiment shown is an example of a plastic package with leads extending from the edges of the plastic housing. The packages generally have a quadrilateral shape. The leadframes within the plastic cavity typically has a center die attachment region as shown, where the die is bonded, and leads extending from two opposing sides. The invention may also be applied to a quad pack design where leads extend from four sides.

Figure 2:
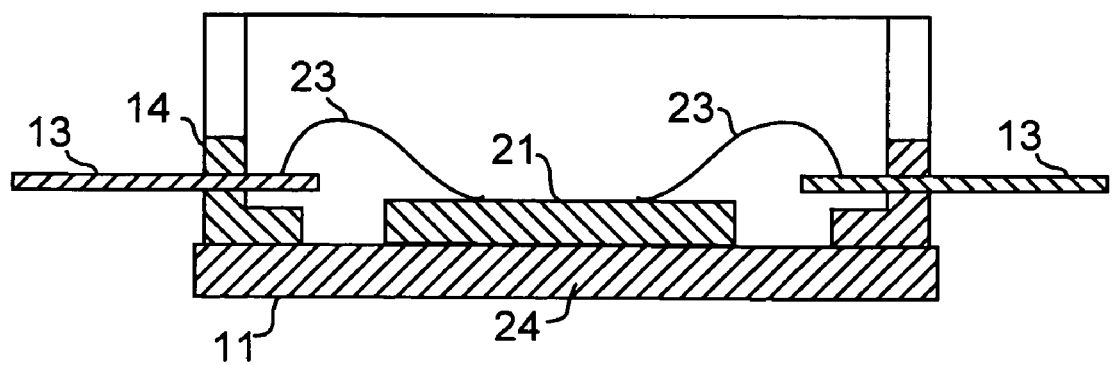
FIG. 2 is a schematic section view through the middle of a package similar to that of FIG. 1, after die attachment.

A section view of FIG. 1 is shown in FIG. 2. The center portion 24 of the leadframe 11 is shown clearly. The leadframe in this example is steel. However, other high strength metals or alloys may be substituted. The leadframe 11 is shown in FIG. 2 with the die 21 attached. Electrical connections in the form of wire bonds are shown at 23. The conventional method for attaching the IC die to the leadframe employs solder as the bonding medium. The specific bonding operation may take a variety of forms. Solder preforms are commonly used.

Figure 3:
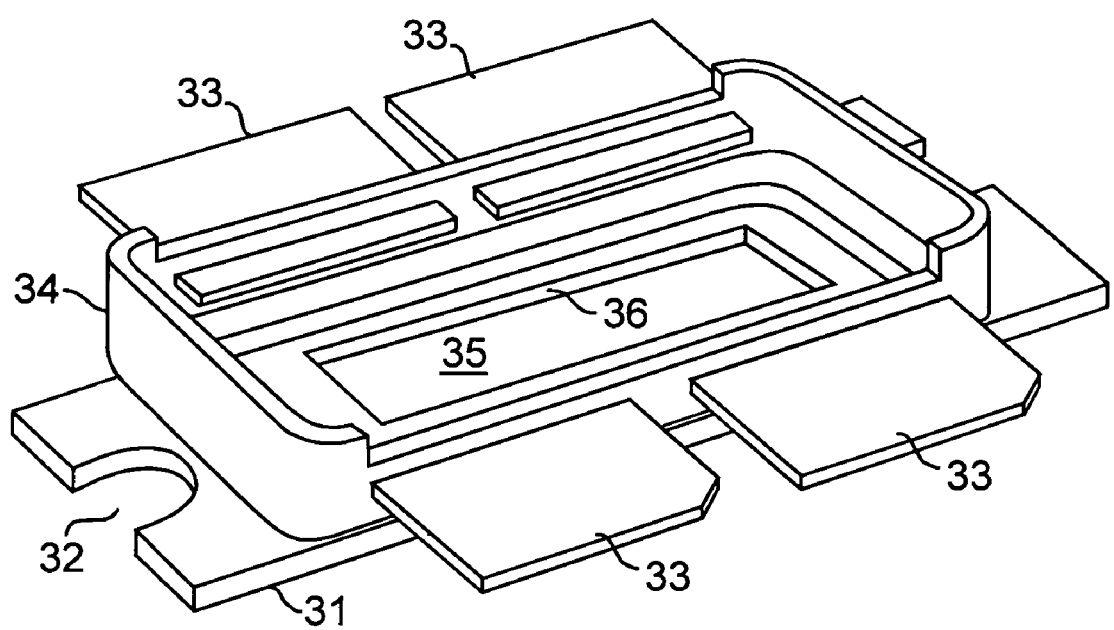
FIG. 3 is a perspective view of a package with a center cutout to implement the invention.
Figure 4:
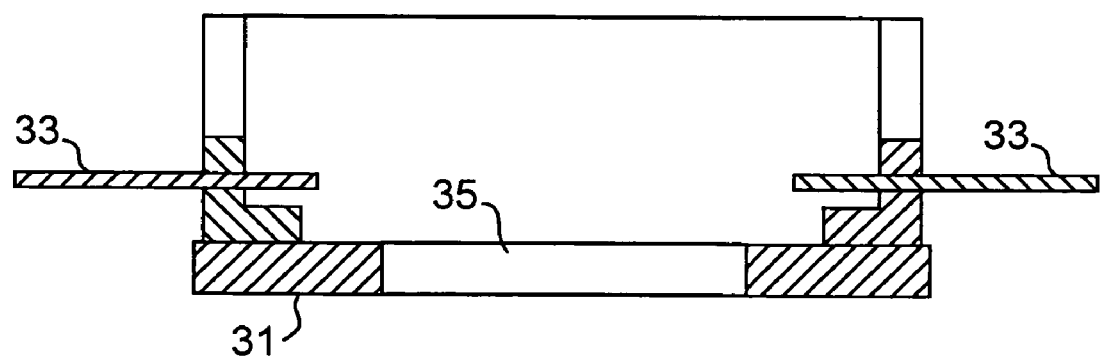
FIG. 4 is a section view of the package of FIG. 3.

The use of steel to form member 11 is advantageous for strength, but not from the standpoint of thermal management. Thus, as illustrated in FIGS. 3 and 4, the center region 35 is cut out. A sidewall of the cutout is shown at 36 in FIG. 3, showing the cutout extending through the thickness of the leadframe. Some advantage would be obtained with a partial cutout, i.e. a cavity formed in the center region of the leadframe, but not extending through the thickness. However, the preferred structure is that shown. That allows another heat sink or thermally conductive material to be assembled below the power transistor thus providing an extensive heat flow path beneath the transistor chip. The RF power transistor die typically populate a narrow strip down the center of the package so that most of the heat is generated along this narrow strip.

Figure 5:
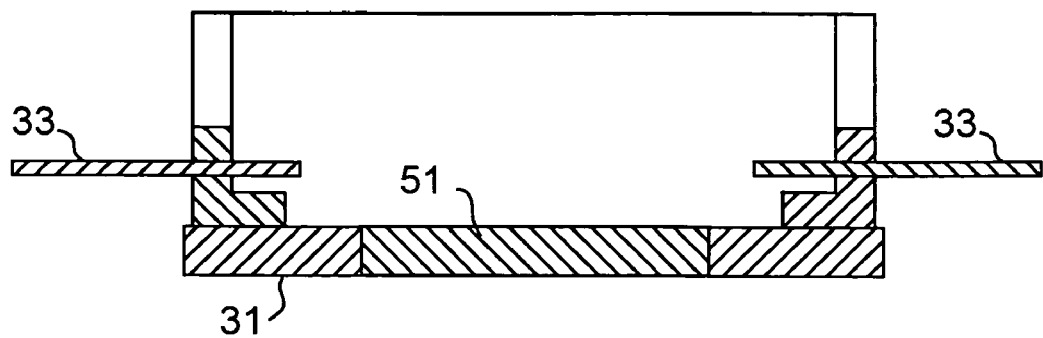
FIG. 5 is a view of the package of FIG. 4 after assembly of the copper insert.

The heat conductive insert, preferably of copper or copper alloy, is shown in FIG. 5 at 51. It is shown with essentially the same thickness as base member 11. However, it can be thicker or thinner.

Figure 6:
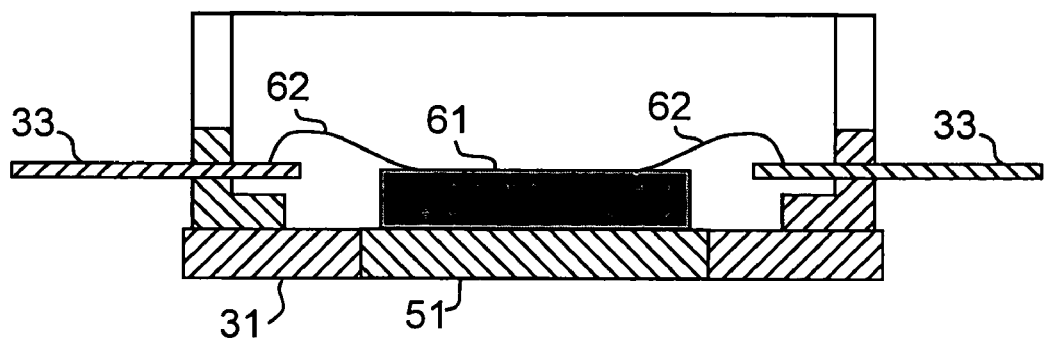
FIG. 6 shows the package of FIG. 5 after die attachment and wire bonding.

The IC package is shown in FIG. 6 with the IC chip 61 die bonded to the insert 51, and electrically connected to the external leads 33 with wire bonds 62. Alternatives exist for mounting and connecting the chip 61. For example, the chip may be bump bonded or flip-chip bonded to the leads using solder bumps. In such an embodiment, the relative elevation of the top surface of the insert and the leads 33 would be suitably adjusted.

Typical die bonding operations use solder. In accordance with recent environmental engineering requirements, most current die bonding operations use a lead-free solder. A suitable die bonding method, with more details on die bonding in this type of package, is described in co-pending application Ser. No. 10/996677, filed on Nov. 24, 2006, Brennan et al. Case 7-86-53-9-8, incorporated by reference herein.

Figure 7:
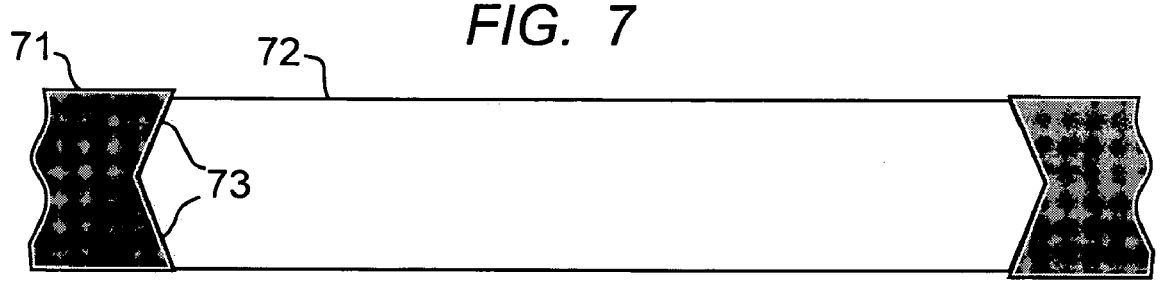
FIGS. 7 and 8 illustrate two approaches for assembling the copper insert.
Figure 8:
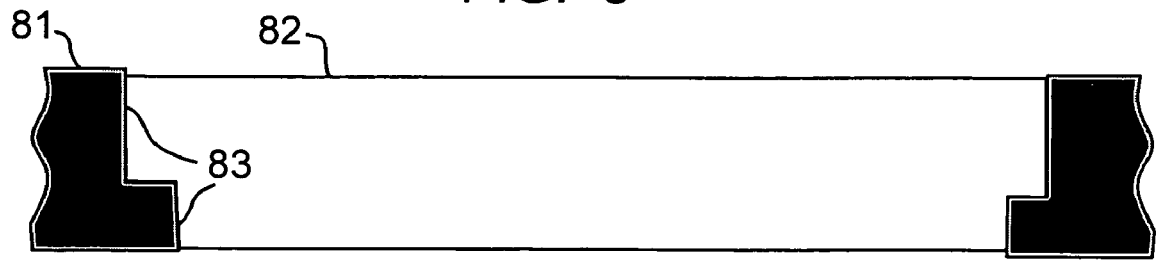

There is a variety of suitable means for attaching the insert to the surrounding metal of the leadframe. A simple approach takes advantage of the relative softness of copper, especially with respect to steel. This allows the copper insert to be easily press fit into the opening in the lead frame. Two embodiments of this method are shown in FIGS. 7 and 8. In FIG. 7, insert 72 is press fit, as shown, into the opening in leadframe 71. The re-entrant sidewalls 73 provide a suitable wall shape for facilitating a press fit. In FIG. 8, the stepped sidewall 83 in leadframe 81 is another configuration for implementing the press fit approach. The bottom portion of sidewall 83 is slightly sloped to allow insert 82 to be press fit as shown. FIGS. 7 and 8 show but two of many essentially equivalent designs. The final leadframe is uniformly plated to facilitate solder or other form of die attach.

With assembly of the IC device in the plastic cavity completed, the cavity may be filled with a protective fill. The pre-molded plastic cavity packaging approach offers the advantage that the plastic housing material and the fill material can be independently chosen. The plastic material for the housing can be chosen for mechanical protection, and is typically a high modulus polymer material. The polymer used as the fill material is typically a material having a low dielectric constant to minimize undesirable parasitic effects on device performance. For example, the plastic cavity housing may be a rigid, thermosetting, polymer, for example a liquid crystal polymer (LCP) such as Ticona Vectra S-135. The fill material may be a thermoplastic polymer, such as Loctite Hysol FP-4470.

As mentioned above, a cost effective high strength material for the leadframe is steel. It is easily manufactured at low cost, and die stamped to produce the shape desired. However, other high strength materials may be substituted. For example, titanium, nickel, or a high strength alloy such as chromalloy could be suitable. These are considered equivalents to steel from a functional standpoint. Likewise, alternative insert materials are available. While copper is cost effective, gold, aluminum, and alloys thereof, may provide equivalent function.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. A plastic cavity package comprising:
   a. a base member, the base member consisting essentially of a first metal, and having a thickness,
   b. a plastic housing attached to a portion of the base member, leaving attachment regions on the base member exposed, the plastic housing comprising an integral plastic body with four sides and a bottom thereby forming a plastic cavity, where the bottom of the plastic cavity has an opening in the center exposing a die-attach region of the base member,
   c. a semiconductor die attached to the die-attach region of the base member, the invention characterized in that the die-attach region of the base member comprises a metal insert extending through the thickness of the base member, the metal insert constructed of a second metal, and having a thickness of approximately the thickness of the base member, wherein the thermal conductivity of the second metal is substantially greater than the thermal conductivity of the first metal, and the strength of the first metal is substantially greater than the strength of the second metal.

2. The package of claim 1 wherein the semiconductor die is a silicon chip.

3. The package of claim 1 wherein the metal insert comprises copper or a copper alloy.

4. The package of claim 3 wherein the base member comprises steel.

5. The package of claim 1 further comprising 2 to 8 leads extending from the plastic housing.

6. The package of claim 1 wherein the insert is press fit into the base member.

7. A plastic cavity package comprising:
   a. a base member, the base member consisting essentially of a first metal, and having a thickness,
   b. a plastic housing attached to a portion of the base member, leaving attachment regions on the base member exposed, the plastic housing comprising an integral plastic body with four sides and a bottom thereby forming a plastic cavity, where the bottom of the plastic cavity has an opening in the center exposing a die-attach region of the base member, the invention characterized in that the die-attach region of the base member comprises a metal insert extending through the thickness of the base member, and having a thickness of approximately the thickness of the base member, the metal insert constructed of a second metal, wherein the thermal conductivity of the second metal is substantially greater than the thermal conductivity of the first metal, and the strength of the first metal is substantially greater than the strength of the second metal.

8. The package of claim 7 wherein the metal insert comprises copper.

9. The package of claim 8 wherein the base member comprises steel.

10. The package of claim 9 further comprising 2 to 8 leads extending from the plastic housing.

11. The package of claim 7 wherein the insert is press fit into the base member.

* * * * *